United States Patent
Herschbach

(10) Patent No.: US 10,048,504 B2
(45) Date of Patent: Aug. 14, 2018

(54) OPTICAL SYSTEM GENERATING A STRUCTURED LIGHT FIELD FROM AN ARRAY OF LIGHT SOURCES BY MEANS OF A REFRACTING OR REFLECTING LIGHT STRUCTURING ELEMENT

(71) Applicant: IEE International Electronics & Engineering S.A., Echternach (LU)

(72) Inventor: Norbert Herschbach, Medernach (LU)

(73) Assignee: IEE International Electronics & Engineering S.A., Echternach (LU)

( * ) Notice: Subject to any disclaimer, the term of this patent is extended or adjusted under 35 U.S.C. 154(b) by 232 days.

(21) Appl. No.: 14/655,773

(22) PCT Filed: Dec. 27, 2013

(86) PCT No.: PCT/EP2013/078071
§ 371 (c)(1),
(2) Date: Jun. 26, 2015

(87) PCT Pub. No.: WO2014/102341
PCT Pub. Date: Jul. 3, 2014

(65) Prior Publication Data
US 2015/0355470 A1    Dec. 10, 2015

(30) Foreign Application Priority Data

Dec. 31, 2012    (LU) .......................... 92 124

(51) Int. Cl.
*G03B 15/02*    (2006.01)
*G02B 27/09*    (2006.01)
(Continued)

(52) U.S. Cl.
CPC .......... *G02B 27/0961* (2013.01); *F21V 5/007* (2013.01); *F21V 5/045* (2013.01);
(Continued)

(58) Field of Classification Search
CPC ............... G02B 27/0961; G02B 27/30; G02B 27/0977; H01S 5/423; F21V 5/08;
(Continued)

(56) References Cited

U.S. PATENT DOCUMENTS 6,240,116 B1 *   5/2001   Lang .................. G02B 27/0905
                                                   372/108
6,402,347 B1 *   6/2002   Maas ...................... F21V 5/007
                                                   315/312
(Continued)

FOREIGN PATENT DOCUMENTS

CN    101608906 A    12/2009
CN    101868690 A    10/2010
(Continued)

OTHER PUBLICATIONS

English translation of Chinese Office Action for CN application No. 201380071845.3, dated Dec. 1, 2016, 6 pages.
(Continued)

*Primary Examiner* — Anh Mai
*Assistant Examiner* — Glenn Zimmerman
(74) *Attorney, Agent, or Firm* — Reising Ethington P.C.

(57) ABSTRACT

An optical system for the generation of a structured light field comprises an array of light sources and a structuring unit separate from said array of light sources, said structuring unit being refractive or reflective and transforming the output of that array of light sources into a structured light illumination by collimating the light beam of each individual light source and directing each beam into the scene under vertical and horizontal angles that can be arbitrarily chosen by refraction or reflection.

16 Claims, 5 Drawing Sheets

(51) Int. Cl.
*H01S 5/42* (2006.01)
*G03B 15/06* (2006.01)
*G02B 27/30* (2006.01)
*F21V 5/04* (2006.01)
*F21V 5/00* (2018.01)
*F21V 5/08* (2006.01)
*G01B 11/25* (2006.01)

(52) U.S. Cl.
CPC ............ *F21V 5/08* (2013.01); *G01B 11/2513* (2013.01); *G02B 27/0977* (2013.01); *G02B 27/30* (2013.01); *G03B 15/06* (2013.01); *H01S 5/423* (2013.01)

(58) Field of Classification Search
CPC ......... F21V 5/045; F21V 5/007; G03B 15/06; G01B 11/2513
USPC .................. 362/11, 235, 236, 97.1; 315/312
See application file for complete search history.

(56) References Cited

U.S. PATENT DOCUMENTS

| | | | |
|---|---|---|---|
| 2006/0221310 A1* | 10/2006 | Kim | H04N 9/315 353/99 |
| 2007/0064423 A1* | 3/2007 | Shimura | G02B 3/08 362/231 |
| 2007/0223095 A1 | 9/2007 | Brown | |
| 2007/0258247 A1* | 11/2007 | Park | G02B 5/0231 362/326 |
| 2008/0084693 A1* | 4/2008 | Shimada | F21S 8/026 362/240 |
| 2009/0116245 A1* | 5/2009 | Yamaguchi | G02B 3/04 362/311.01 |
| 2010/0238648 A1* | 9/2010 | Tsukahara | G02B 6/005 362/97.1 |
| 2010/0284194 A1* | 11/2010 | Miyashita | F21V 5/04 362/311.09 |
| 2010/0296725 A1 | 11/2010 | Seiffert | |
| 2011/0052205 A1* | 3/2011 | Yu | H04B 10/801 398/142 |
| 2013/0038881 A1* | 2/2013 | Pesach | G01B 11/25 356/610 |

FOREIGN PATENT DOCUMENTS

| | | | | |
|---|---|---|---|---|
| CN | 101927395 A | 12/2010 | | |
| CN | 101957183 A | 1/2011 | | |
| DE | 19633686 A1 | 2/1988 | | |
| DE | 19633686 A1 | 2/1998 | | |
| DE | 102011014779 A1 | 9/2012 | | |
| WO | 2009144635 A2 | 12/2009 | | |
| WO | WO 2012123128 A1 * | 9/2012 | ............. | G01B 11/25 |
| WO | WO 2013127974 A1 * | 9/2013 | ............. | G01S 17/48 |

OTHER PUBLICATIONS

International Search Report and Written Opinion dated Apr. 1, 2014 re: Application No. PCT/EP2013/078071; citing: DE 10 2011 014779 A1, US 2007/223095 A1, WO 2009/144635 A2 and DE 196 33 686 A1.

* cited by examiner

OPTICAL SYSTEM GENERATING A STRUCTURED LIGHT FIELD FROM AN ARRAY OF LIGHT SOURCES BY MEANS OF A REFRACTING OR REFLECTING LIGHT STRUCTURING ELEMENT

TECHNICAL FIELD

The present invention generally relates to the area of structured light applications, e.g. the 3D mapping by structured light triangulation e.g. in a structured light 3D scanner, and more specifically to an optical system generating a structured light field using the output of an array of light sources.

BACKGROUND ART 3D mapping of a scene by structured light triangulation comprises illuminating the scene with a light pattern and observing the illuminated scene with a camera whose optical axis is offset from the illumination source. If a given ray from the illumination intersects a reflective object, an image of this ray will be formed on the camera. The location of the image of this ray together with knowledge about the exact geometry of illumination-imaging setup allows the determination of the relative position of the intersection between the light ray and the object. This supposes that one knows which ray of the structured light pattern intersected the object. Finding the ray of the pattern, which corresponds to a point in the image, is often called the correspondence problem.

In order to solve this problem, it has been proposed to generate a spatially coded structured light by an array of laser diodes. The laser diodes may be of the surface-emitting type, where the light is emitted in the direction perpendicular to the semiconductor wafer surface. Plural such laser diodes are integrated monolithically to form an array. The position of the individual laser diodes in the array is coded spatially to form a non-regular unique pattern.

The challenge with this type of illumination unit is to distribute the individual light sources in such a way on a given chip area, that the pattern of the positions of the light sources in any given subarea of the chip area is unique.

Apart from spatial coding of the structured light field, structured light imaging applications require typically a specific field of view (FOV) for the system, a certain range of distances, over which the system should operate accurately, as well as a specific minimum size of details in the scene objects which should still be resolved. These requirements vary from one application to the other.

For some applications, for example, it would be useful, if the distance range, over which the system should operate, could be set by design to be varying with the angles spanning the FOV. Similarly, in some applications an optimized structured light field would allow for a varying resolution over the field of view, that is to say a varying graininess or a varying density of features in the structured light field.

For structured light generators based on arrays of light sources a spatial coding as well as special requirements as just mentioned could in principle be fulfilled by using a dedicated arrangement of the light sources in the array and projecting the output of this array into the FOV using an appropriate projection optics system. However, for cost reasons, and because of diverse technical limitations the size of such an array of light sources and the freedom to arrange the light sources within the array is limited, such that the flexibility to design a system to the requirements of the application in this way is too limited.

BRIEF SUMMARY

The disclosure provides an optical system which gives a larger flexibility to design the structured light field.

The present invention relates to an optical system which transforms the output of an array of light sources into a structured light illumination by collimating, deflecting or reflecting the light beam of each individual light source and thus directing each beam into the scene under vertical and horizontal angles that can be arbitrarily chosen. The freedom of choice of the spatial direction of each beam enables a high flexibility in the adaptation of the illumination to the particular requirements of an application regarding the distribution of light beams over the field of view. This can be achieved with standard low-cost light source arrays, not requiring complex arrangements of the individual light sources.

The present invention generally relates to an optical system for the generation of a structured light field to illuminate a scene comprising an array of light sources and a structuring unit arranged in front of said array of light sources. The light sources are preferably individual small aperture sources, such as LED or VCSEL (vertical cavity surface emitting laser). The structuring unit comprises an array of first optical surfaces having individual orientations, which means that the optical surfaces are individually inclined with respect to the light beams emanating from the individual light sources. The individual orientations of said optical surfaces of said structuring unit are configured so that individual light beams emanating from said light sources are individually directed into the scene under respective vertical and horizontal angles by refraction and/or reflection at said first optical surfaces.

With the optical system according to the present invention, it is possible to produce a pattern in the illumination field of high radiance and contrast, even at a large distance from the illumination unit. The components of the optical system thereby ensure the collimation of the light beams of said light sources as well as the generation of an arbitrarily chosen light pattern for projection independently of the exact form of the original arrangement of said light sources within said array of light sources. The use of a structuring unit, which is preferably separate from said array of light sources, enables to shape the illumination field according to the application specific requirements. As the shape of the illumination field is determined by the configuration of the structuring unit, it will be appreciated that for a given arrangement of the light sources, it will be possible to change the shape of the illumination field by replacing the structuring unit.

In a possible embodiment of the invention, said structuring unit is made of a transparent optical material, i.e. a material means transparent to the light from the light sources, and comprises a rear surface facing said array of light sources and a front surface facing the scene to be illuminated. Said array of first optical surfaces is preferably an integral part of a front surface of said structuring unit and wherein said structuring unit is arranged such that individual light beams from said light sources pass trough said optical material of said structuring unit and are refracted at said front surface when said light beams emerge form said transparent optical material. The skilled person will of course unambiguously derive that in an alternative embodiment, the first optical surfaces may be an integral part of the rear surface of said structuring unit. In this case the individual light beams from said light sources pass are refracted at said rear surface when said light beams enter said transparent optical material.

In a possible embodiment, the structuring unit comprises an array of second optical surfaces, said array of second optical surfaces being an integral part of said rear surface of said structuring unit, each of said second surfaces being arranged in parallel with a respective one of said first surfaces, thereby forming an array of individually oriented plane-parallel plates which is employed to translate each of the individual light beams laterally.

Alternatively the rear surface of said structuring unit may be a plane surface and oriented such that said individual light beams of said light sources pass said rear surface substantially at right angles.

In a preferred embodiment, the optical system further comprises an array of lenses for individually collimating the light beams of said array of light sources. The lenses of said array of lenses may e.g. be integrated in a separate lens unit, said separate lens unit being arranged between said array of light sources and said structuring unit, or said lenses of said array of lenses may be integrated into said rear surface of said structuring unit or even into said first optical surfaces of said structuring unit.

In another embodiment, the array of first optical surfaces is an array of reflective surfaces, said array of reflective surfaces being arranged such that individual light beams from said light sources are reflected at said reflective surfaces when said light beams impinge on said array of first optical surfaces. An array of lenses may be used for individually collimating the light beams of said array of light sources. The lenses of said array of lenses may be integrated into a separate lens unit to be arranged between said array of light sources and said structuring unit or may be integrated into said first optical surfaces of said structuring unit.

The optical system may further comprise a collimation unit with at least one lens (preferably two separate lenses) for collimating a plurality of said light beams of said array of light sources. The system may comprise an additional optical system including one or more refractive or diffractive lens elements and/or reflective elements, said additional optical system being configured for adapting a generated illumination pattern in density of beams with respect to both angles in the field of view which is covered by the illumination to particular chosen values required by a specific application.

The structuring unit is preferably made of an optical polymer material (e.g. a plastic material), and produced by cost-effective production methods such as injection molding and/or compression injection molding and/or embossing methods.

The optical system enables the realization of spatial coding methods in the structured light field with more freedom and gives a larger flexibility to design the structured light field according to the requirements of the application regarding FOV, distribution of the graininess of the structured light field over the FOV as well as the range of distances over which the system should function as a function of the angles spanning the FOV. This is even easily achieved when the illumination generator is based on an array of light sources arranged in a regular pattern.

For applications requiring large distances of operation high optical power in the structured light field has to be generated in a part of the FOV. Standard holography-based methods to generate the structured light pattern cannot achieve the high radiance of the illumination needed.

Using arrays of light sources of high radiance the optical system described by the present invention allows for the generation of a structured light field, which can be tailored to fill a given FOV and to follow the distributions of graininess and intensity as required by the application, without loss of radiance. Furthermore, the invention provides an increased flexibility in the design of the structured light field for applications requiring an illumination of large radiance, while reducing cost as compared to other methods. For example, the possibility to use a regular light source arrangement (densely packed) leads to the best use of expensive substrate material.

BRIEF DESCRIPTION OF THE DRAWINGS

Further details and advantages of the present invention will be apparent from the following detailed description of several not limiting embodiments with reference to the attached drawings, in which.

DESCRIPTION OF PREFERRED
EMBODIMENTS

Prior to describing details of several possible realizations of the invention, an overview of a general setup of the illuminator is given. A structured light illumination generator using the present invention will have a general construction as schematically shown in FIG. 1.

Figure 1:
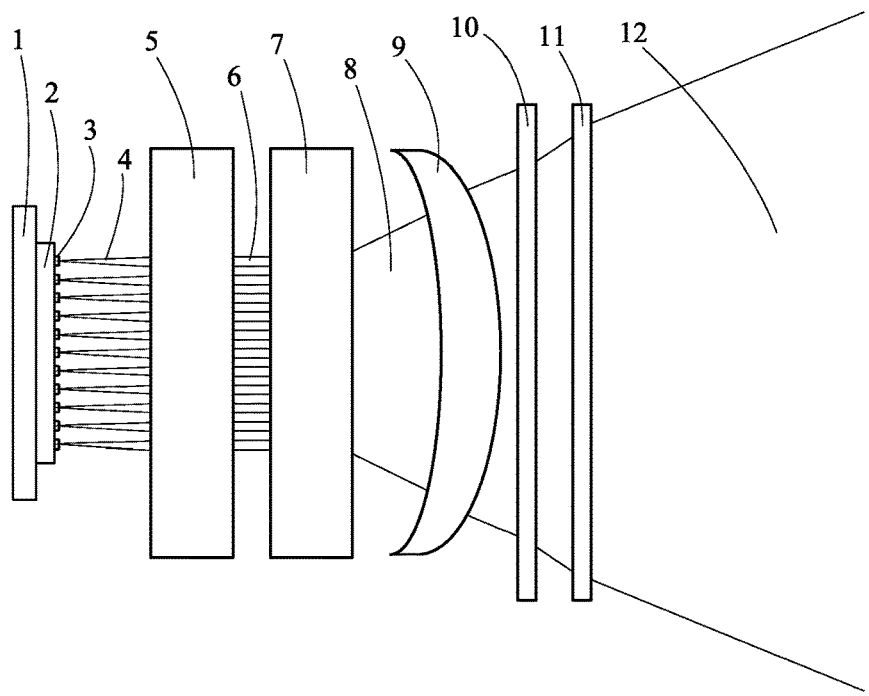
FIG. 1 shows a schematic view of the general construction of the structured light generator and its components.

FIG. 1 shows a schematic view of the general construction of the structured light generator and its components. The different features shown in FIG. 1 are as follows: 1 heat sink and mount of the array of light sources; 2 array of light sources; 3 individual light source; 4 divergent single light beam; 5 beam collimation unit; 6 beams of smaller divergence; 7 structuring unit; 8 structured light beams; 9 auxiliary lens or optical system; 10 auxiliary grating unit; 11 auxiliary element to direct parts of the light field into particular regions of the field of view; 12 projection of the structured light field.

In order to realize the illuminator an array of light sources (2) is considered, which can be an array of light emitting diodes (LEDs), an array of edge-emitting diode lasers or an array of vertical cavity surface-emitting lasers (VCSELs).

The array of light sources (2) typically has a mount which functions as heat sink (1) or is thermally connected to a heat sink. The current supply required for the array of light sources is not shown in FIG. 1.

Depending on the type of light source used the light beams (4) emitted from the individual light sources in the array may be too divergent to be used directly. Therefore a collimation unit (5) may be required to obtain beams with smaller divergence (6). The collimation unit can comprise an array of small lenses, a micro-lens array, with each lens collimating a single beam, or one or more large diameter single lenses or other optical systems collimating all beams emitted from the array of sources, or also a combination of a lens array and an optical system of large diameter. The resulting array of light beams has a sufficiently small divergence to be transformed by the structuring unit (7) into a structured light field.

Different possible realizations of the structuring unit (7) and their integration into the system will be discussed in more details in the following paragraphs. Depending on the realization of the structuring unit (7) an auxiliary lens or optical system (9) can be used to project the structured light field distribution into the FOV as required by the application, and/or to achieve the desired beam radius and divergence of the individual beams forming the structured light field. The optical system can further be fit with a grating element (10), which allows for a multiplication of the output beams through the projection of the different diffraction orders into different regions of the field of view, effectively repeating in different diffraction orders the light field structure produced by the previously described elements.

Although the use of optical reflection gratings is conceivable, optical transmission gratings are preferable for this use. Different types of optical gratings, for example, blazed binary gratings, could be used and design parameters of the grating can be chosen to adapt the intensity in each diffraction order to the intensity distribution required in the application. It is also conceivable that only a part of the structured light field falls on the grating and is split into the different diffraction orders. An additional optional element (11) to direct parts of the generated light field into particular directions is also shown in FIG. 1. This optical element can be realized using segmented flat surfaces like with a flat prism, or using curved surfaces like with a cylindrical lens or combinations of these two or by using reflective optical systems.

Figure 2:
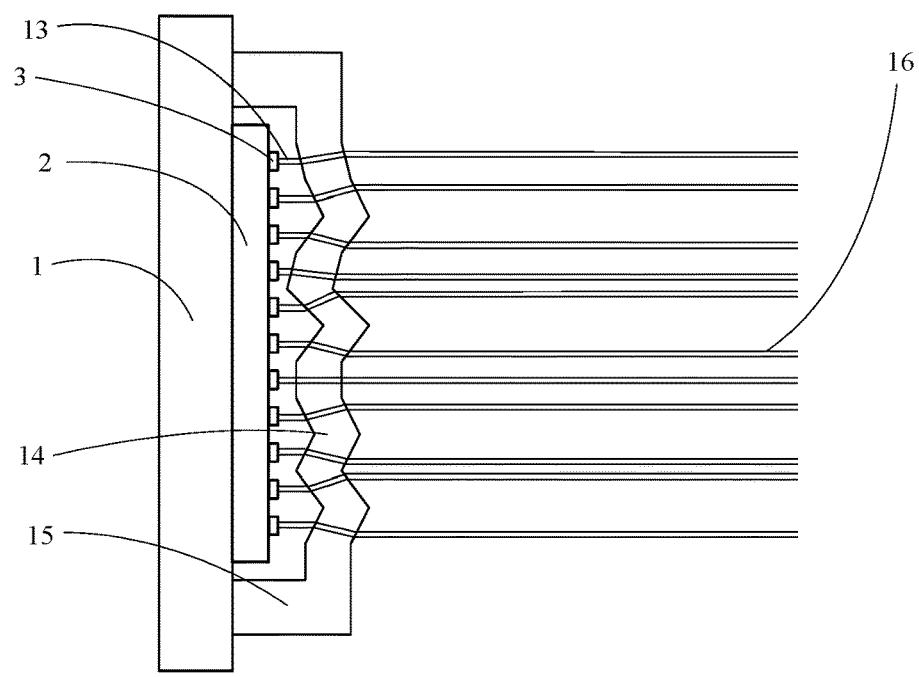
FIG. 2 shows an embodiment of a structuring unit based on an array of inclined planes realizing a spatial coding.

A first simple realization of a structuring unit based on an array of plane parallel plates is shown in FIG. 2. Legend to FIG. 2: 13 light beam from individual light source; 3 individual light source; 2 array of light sources; 1 heat sink and mount of the array of light sources; 14 array of plane parallel plates; 15 stand for the array of plane parallel plates (14); 16 array of translated light beams.

When a light beam traverses an inclined plane parallel plate of transparent optical material with a different refractive index than the medium outside of the plate, it is translated in the direction of the inclination of the plane parallel plate on exit from the plate. The shift effect can be employed to translate the light beams from the individual light sources with respect to each other. This is achieved by arranging plane parallel plates, which can all have different angles of inclination in an array as shown in FIG. 2. The inclination can be in a different direction for each plate element in the array. Additionally or alternatively the thickness of the plates can be varied within the array. The resulting array of beams then has to be projected into the scene using a lens or an optical system corresponding to element number (9) in FIG. 1. The spatial coding is effectively achieved by the different distances between the illumination spots on scene objects obtained in this way. To realize the array of plane parallel plates different technologies can be used. Possible materials range from optical glasses to optical plastic materials. Technologies developed for the precision manufacturing of micro-optical components like micro-lens-arrays may be employed. Examples are precision micro-machining, lithographic and etching techniques as well as hot embossing for quartz glass and other glass materials. For optical polymer materials also low-cost series production technologies such as injection molding, compression injection molding as well as embossing methods are well established.

The arrangement of light source array and array of plane parallel plates as shown in FIG. 2 is suitable when the divergence of the individual light sources is small enough and the distance between the single sources large enough such that the paths of the single beams are well separated through the optical setup. For light sources producing beams of larger divergence or when the array of plane parallel plates cannot be placed close enough to the array of light sources or when the thickness of the plane parallel plates has to be chosen larger for stability reasons, for example, it may be necessary to reduce the divergence of the individual light beams as produced by the light source using a lens array or a micro-lens array. This alternative is schematically drawn in FIG. 3.

Figure 3:
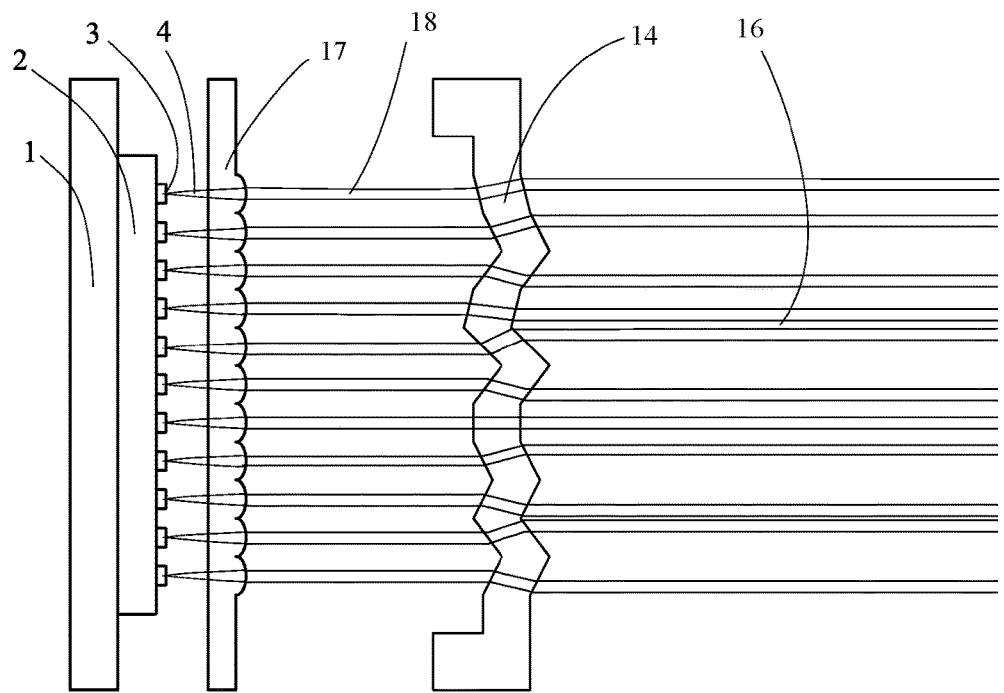
FIG. 3 shows an embodiment of a structuring unit based on an array of inclined plane parallel plates with light beam collimation using a lens array.

Legend to FIG. 3: 1 heat sink and mount for the array of light sources; 2 array of light sources; 3 individual light source; 4 divergent single light beam; 17 collimating lens array; 15 collimated single light beam; 14 array of plane parallel plates; 16 array of translated light beams.

For some light sources it can be preferable to have also a lateral magnification of the array in combination with the collimation of the light beams before the resulting beam array is transformed in a structuring unit. This can be achieved using an arrangement of optical elements as schematically drawn in FIG. 4. It should be noted that the beam array behind the second lens element (20) will typically fan out which is not made visible in the drawing, and could mean that an additional curvature has to be taken into account in the design of the plane parallel plate array element (14).

Figure 4:
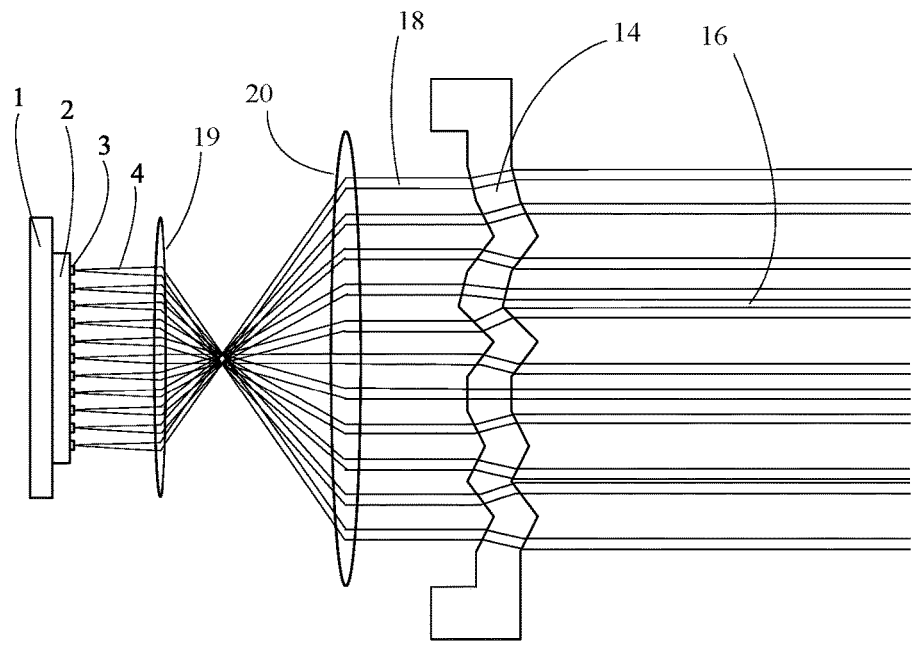
FIG. 4 shows an embodiment of a structuring unit based on an array of inclined plane parallel plates with a magnifying and collimating optical system for the source array.

Legend to FIG. 4: 1 heat sink and mount for the array of light sources; 2 array of light sources; 3 individual light source; 4 divergent single light beam; 14 and 20 lens system for lateral magnification and collimation of the individual light beams; 18 collimated individual beams; 14 array of plane parallel plates; 16 array of translated light beams.

Another possible embodiment of the structuring unit is based on the refractive deflection of light beams experienced when crossing the interface between an optically denser medium to an optically less dense medium under an angle, for example when a light beam leaves a glass body through an inclined surface such as a prism. We propose an optical element comprising a flat entrance surface and having an array of inclined flat exit surfaces. Assuming the array of input beams geometrically aligned with the array structure of prism surfaces, this optical element refractively deflects each beam of the collimated output of a light source array in a different direction determined by the inclination angle and inclination direction chosen for the respective prism element the light beam is passing.

Figure 5:
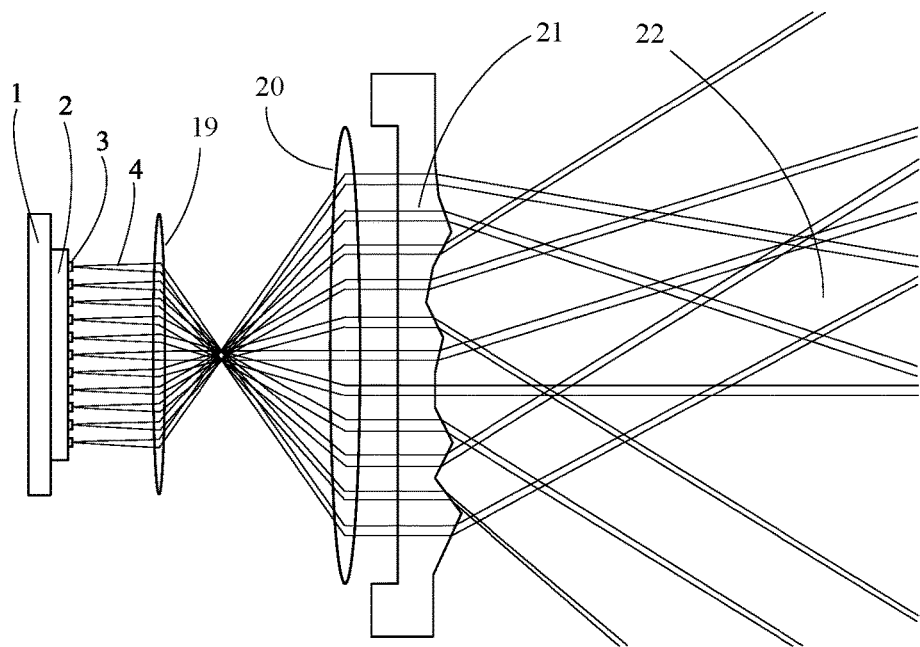
FIG. 5 shows an embodiment of a structuring unit based on an array of prism surfaces with a magnifying and collimating optical system for the source array.

FIG. 5 shows a schematic drawing of the array of prisms element and its integration into the optical system. Legend to FIG. 5: 1 heat sink and mount for the array of light sources; 2 array of light sources; 3 individual light source; 4 divergent single light beam; 19 and 20 lens system for lateral magnification and collimation of individual beams; 21 array of prisms; 22 array of light beams for the structured light illumination.

For the production of the array of prisms optical element similar manufacturing technologies can be employed as for the optical element comprising an array of plane parallel plates described above. Optical glasses as well as a range of optical plastic materials can be used. Standard precision manufacturing methods of micro-optical components like precision micro-machining, lithographic and etching techniques or hot embossing of glass materials can be employed as well as the low-cost series production technologies for optical polymer materials, injection molding, compression injection molding or embossing methods.

Figure 6:
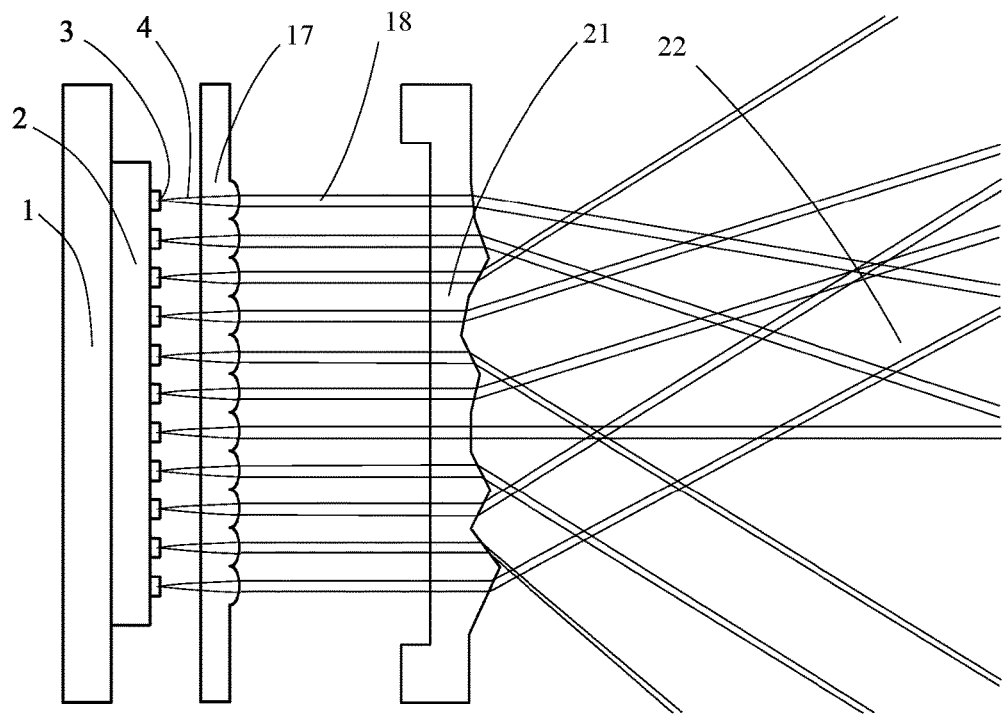
FIG. 6 shows an embodiment of a structuring unit based on an array of prism surfaces with a beam collimation achieved with a lens array.

For light source arrays that can be collimated using a lens array the optical setup can become more compact as is schematically drawn in FIG. 6. Legend to FIG. 6: 1 heat sink and mount for the array of light sources; 2 array of light sources; 3 individual light source; 4 divergent single light beam; 17 collimating lens array; 18 collimated single light beam; 21 array of prism surfaces; 22 array of light beams for the structured light illumination.

Figure 7:
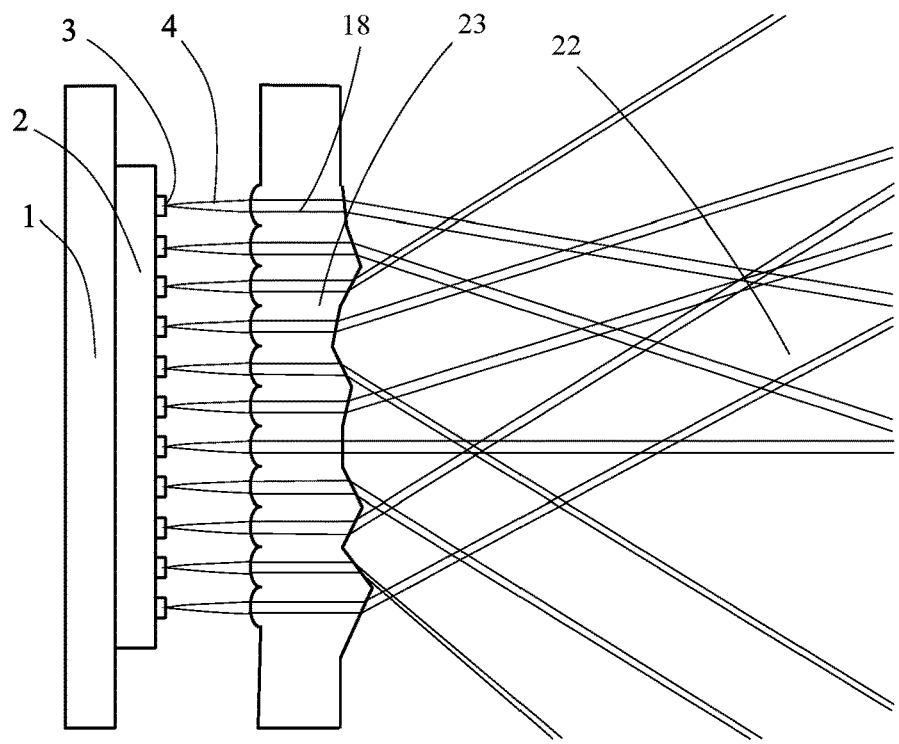
FIG. 7 shows an embodiment of a structuring unit based on an array of prism surfaces combined with a lens array in a single optical component

It is also possible to combine the collimating lens array and the array of prism surfaces in a single optical element. This realization is schematically represented in FIG. 7. Legend to FIG. 7: 1 heat sink and mount for the array of light sources; 2 array of light sources; 3 individual light source; 4 divergent single light beam; 18 collimated single light beam; 23 collimating lens array combined with an array of prism surfaces; 22 array of light beams for the structured light illumination. Apart from allowing a compact construction the combination of the two optical elements has the advantages of requiring less alignment procedures and enables a cost reduction in production.

Another possible realization of the structuring unit, which also integrates the collimation of the light beams in a single optical element comprises a collimation lens array, in which a variation of the lateral positions of the lenses in the array is introduced. The lateral displacement of the optical axis of each lens with respect to the position of the source of light results in an angle between the optical axis and the collimated beam which leaves the lens. A corresponding optical setup is shown schematically in FIG. 8. Legend to FIG. 8: 1 heat sink and mount for the array of light sources; 2 array of light sources; 3 individual light source; 4 divergent single light beam; 24 collimating lens array with laterally displaced lenses; 22 array of light beams for the structured light illumination. In addition to the lateral displacement of each lens element a tilt of its optical axis and adaptations of the lens surface shape can be considered to reduce lens aberration effects and improve the collimation of the light beam. Similarly to other realizations discussed above materials and production technologies common in the manufacturing of micro-optical components can be applied to manufacture this optical element.

Figure 8:
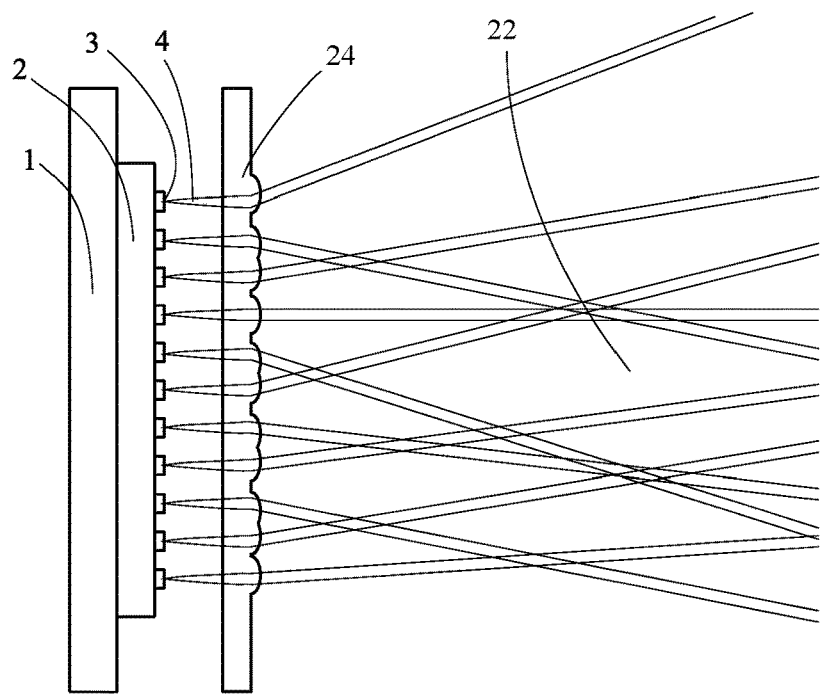
FIG. 8 shows an embodiment of a combined collimation and structuring unit using a lens array with a variation of the lateral positions of the lenses.

Constructions like those shown in FIGS. 7 and 8, which integrate the collimation and the structuring function in a single optical element that can be produced in series with low-cost procedures and materials, are highly preferable regarding manufacturing cost. For applications required to work over large distance, an auxiliary optical element corresponding to number (9) in FIG. 1 can be added to improve the collimation of the individual laser beams.

Figure 9:
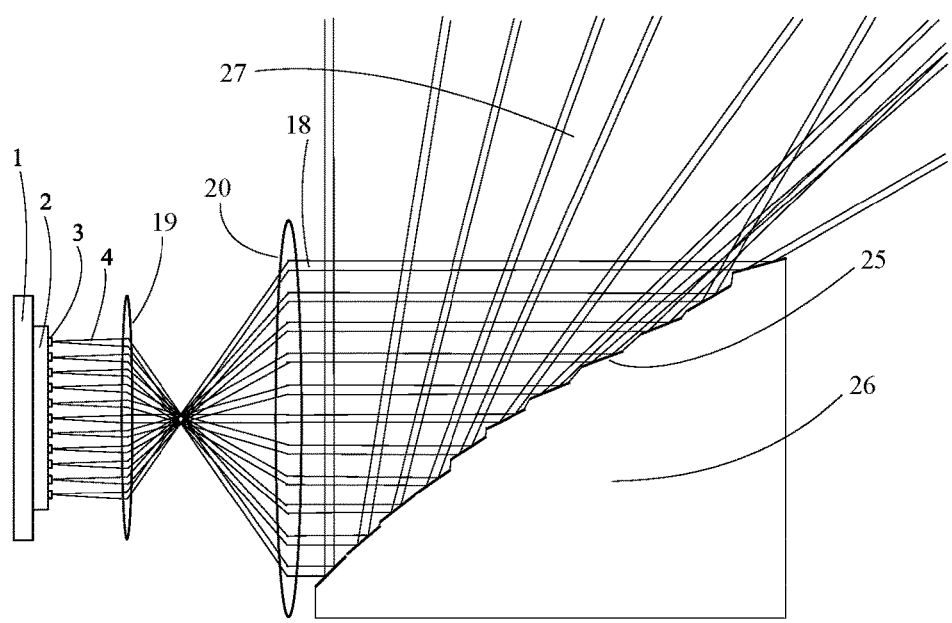
FIG. 9 shows an embodiment of a structuring unit based on an array of reflective surfaces.

A further realization based on an array of reflective surfaces is drawn schematically in FIG. 9. Legend to FIG. 9:
1 heat sink and mount for the array of light sources; 2 array of light sources; 3 individual light source; 4 divergent single light beam; 19 and 20 lens system for lateral magnification and collimation of the individual light beams; 18 collimated individual beams; 25 array of reflective surfaces with different inclinations; 26 bulk structure holding the array of reflective surfaces. 27 array of beams for structured light illumination.

After the passing through an optical system which collimates the beam of each light source in the array, the light falls in an array of well-separated beams upon an optical element that comprises an arrangement of reflective surfaces in an array such that each beam is reflected at a single surface. For each reflective surface the two inclination angles with respect to the direction of the incoming beam can be arbitrarily chosen within limits of the practicable given by the requirement that the bulk structure (26) supporting the array of surfaces has to be of a practical shape and that the paths of the reflected beams are not obstructed. The individual mirror surfaces can also be given a curved shape to improve the collimation of the beams. The bulk structure (26) can be made of any material suitable for precision micro-machining and suitable to be given a reflective coating. Also polymer materials and low-cost production technologies like injection molding can be used. Several standard technologies exist to apply the reflective coating which could be a metal coating for example of silver or aluminum or a multilayer dielectric coating.

The invention claimed is:

1. An optical system configured to generate a structured light field to illuminate a scene, comprising:
   an array of light sources; and
   a structuring unit arranged in front of said array of light sources and configured to produce a structured light pattern to illuminate the scene, said structuring unit comprising an array of first optical surfaces, wherein each of the first optical surfaces has an having individual orientation that enables spatial coding of the structured light pattern, wherein the individual orientations of said optical surfaces of said structuring unit are configured so that individual light beams emanating from said light sources are individually directed into the scene under respective vertical and horizontal angles by refraction and/or reflection at said first optical surfaces.

2. The optical system according to claim 1, wherein said structuring unit is made of a transparent optical material and comprises a rear surface facing said array of light sources and a front surface facing the scene to be illuminated, and wherein said array of first optical surfaces is an integral part of a front surface of said structuring unit and wherein said structuring unit is arranged such that individual light beams from said light sources pass through said optical material of said structuring unit and are refracted at said front surface when said light beams emerge from said transparent optical material.

3. The optical system according to claim 1, further comprising an array of lenses configured for individually collimating the light beams of said array of light sources.

4. The optical system according to claim 1, wherein said array of first optical surfaces is an array of reflective surfaces, said array of reflective surfaces being arranged such that individual light beams from said light sources are reflected at said reflective surfaces when said light beams impinge on said array of first optical surfaces.

5. The optical system according to claim 1, further comprising a collimation unit with at least one lens configured for collimating a plurality of said light beams of said array of light sources.

6. The optical system according to claim 1, further comprising an additional optical system including one or more refractive or diffractive lens elements or reflective elements, said additional optical system being configured for adapting a generated illumination pattern in density of beams with respect to both angles in the field of view which is covered by the illumination to particular chosen values required by a specific application.

7. The optical system according to claim 1, wherein said structuring unit is made of an optical polymer material.

8. The optical system according to claim 1, wherein said array of light sources is a VCSEL array.

9. The optical system according to claim 2, wherein said structuring unit comprises an array of second optical surfaces, said array of second optical surfaces being an integral part of said rear surface of said structuring unit, each of said second surfaces being arranged in parallel with a respective one of said first surfaces.

10. The optical system according to claim 2, wherein said rear surface of said structuring unit is a plane surface and wherein said rear surface is oriented such that said individual light beams of said light sources pass said rear surface substantially at right angles.

11. The optical system according to claim 3, wherein said lenses of said array of lenses are integrated in a separate lens unit, said separate lens unit being arranged between said array of light sources and said structuring unit.

12. The optical system according to claim 3, wherein said lenses of said array of lenses are integrated into said rear surface of said structuring unit.

13. The optical system according to claim 3, wherein said lenses of said array of lenses are integrated into said first optical surfaces of said structuring unit.

14. The optical system according to claim 4, further comprising an array of lenses configured for individually collimating the light beams of said array of light sources.

15. The optical system according to claim 7, wherein said structuring unit is manufactured by injection molding or compression injection molding or embossing.

16. The optical system according to claim 14, wherein said lenses of said array of lenses are integrated into said first optical surfaces of said structuring unit.

* * * * *

UNITED STATES PATENT AND TRADEMARK OFFICE
CERTIFICATE OF CORRECTION

Page 1 of 1

PATENT NO. : 10,048,504 B2
APPLICATION NO. : 14/655773
DATED : August 14, 2018
INVENTOR(S) : Norbert Herschbach It is certified that error appears in the above-identified patent and that said Letters Patent is hereby corrected as shown below:

In the Claims

Claim 1, Column 8, Line 39, the word "having" should be deleted.

Signed and Sealed this
Sixteenth Day of April, 2019

Andrei Iancu
*Director of the United States Patent and Trademark Office*